(12) United States Patent
Kyle

(10) Patent No.: US 6,413,800 B1
(45) Date of Patent: Jul. 2, 2002

(54) HERMETIC COLD WELD SEAL

(75) Inventor: Robert Joseph Stephen Kyle, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/778,331

(22) Filed: Jan. 2, 1997

Related U.S. Application Data

(62) Division of application No. 08/410,153, filed on Mar. 23, 1995, now Pat. No. 5,641,713.

(51) Int. Cl.[7] .................. H01L 21/44; H01L 21/48; H01L 21/50
(52) U.S. Cl. .................. 438/115; 438/121; 438/125
(58) Field of Search ............... 156/330, 275.5; 437/215, 216, 222, 245, 246, 218; 257/704, 710; 438/115, 121, 125

(56) References Cited

U.S. PATENT DOCUMENTS

| | | | |
|---|---|---|---|
| 4,192,433 A | 3/1980 | Hascoe | 220/200 |
| 4,382,327 A | 5/1983 | Bardens et al. | 29/588 |
| 4,818,730 A | 4/1989 | Smith, III et al. | 501/15 |
| 5,041,695 A | 8/1991 | Olenick et al. | 174/52.4 |
| 5,293,511 A | 3/1994 | Poradish et al. | 257/434 |

OTHER PUBLICATIONS

Hanson, et al "Uncooled Thermal Imaging", Texas Instruments Technical Journal, vol. 11, No. 5. Sep.–Oct. 1994 p.2–10.
Neal, et al "Texas Instruments Uncooled Infrared Systems"; Texas Instruments Technical Journal, vol. 11, No. 5. Sep.–Oct. 1994 p. 11–18.
Witter, et al "Pyroelectric Materials for Uncooled IR Detectors";Texas Instruments Technical Journal, vol. 11, No. 5. Sep.–Oct. 1994 p.19–26.
Belcher, et al "Uncooled Infrared Detector Processing"; Texas Instruments Technical Journal, vol. 11, No. 5. Sep.–Oct 1994 p.27–36.
"Technique for Obtaining an Environmentally Secure Adhesive Seal", 700 IBM Technical Disclosure Bulletin 29 (1986) Dec., No. 7, New York, USA, pp. 3085–3087.

Primary Examiner—David E. Graybill
(74) Attorney, Agent, or Firm—Jacqueline J. Garner; W. James Brady, III; Frederick J. Telecky, Jr.

(57) ABSTRACT

A hermetically cold weld sealed package and method for sealing where a metal seal member 28 is placed along the edge of a base 36, an organic sealant 26 is placed along the outside of the base adjacent the metal seal member 28, and a lid 30 is placed over the base 36 to create a hermetically sealed cavity 46. The process takes place at room temperature environment in an inert environment, and on heating of the metal sealing member 28 is required. The shrinkage of the organic sealant 26 during curing applies pressure to the metal seal member 28, enhancing the effectiveness of the hermetic seal.

11 Claims, 4 Drawing Sheets

HERMETIC COLD WELD SEAL

This is a division of application Ser. No. 08/410,153, filed Mar. 23, 1995, U.S. Pat. No. 5,641,713.

FIELD OF THE INVENTION

This invention generally relates to the manufacture of integrated circuits (IC's), hybrid systems, and more specifically, to the packaging thereof.

BACKGROUND OF THE INVENTION

A common practice in the packaging of IC's (integrated circuits) is to mount the IC die (chip) onto a header which electrically connects the pads of the chip to complete the electrical connection to the socket pins. This assembly is then encapsulated in a plastic potting compound such as epoxy. In some cases, epoxies are used to adhere the lid to the base of an IC body. However, moderately high temperatures may cause this epoxy to release gaseous products which may damage the IC. Moisture coupled with internal IC materials has been a cause of catastrophic failure in some IC and hybrid systems. In the industry, an epoxy seal is generally considered not to be hermetic, since epoxies may gradually leak gaseous products from the surrounding atmosphere into the IC.

An alternative to plastic packaging is hermetic packaging. Some IC's and hybrid systems do not permit plastic encapsulation because of the application environment; for example, military standards for hermetic packages typically dictate that the seal material be metal. One type of hermetic seal in the prior art comprises an alumina ceramic base with printed wiring connections to electrically connect the package pins to the pad connections of the IC chip. The chip is surrounded by a suitable metal ring body, such as "Kovar", which is hermetically sealed to the ceramic base. A lid is then hermetically sealed to this metal body. The hermetic sealing operation requires high temperatures to seal the lid to the body while at the same time providing an internal inert gaseous atmosphere. Another type of package is ceramic with plated metal seal (e.g. W, Ni and Au) surfaces on the upper edge of the base and on the lower edge of the lid. Solders (e.g. SnPb, SnAu) are typically used to solder seal the lid to the base.

SUMMARY OF THE INVENTION

The present invention is a hermetically sealed system, comprising a base, a metal sealing member mounted on the top edge of the base, an organic sealant mounted on the top edge of the base adjacent the metal sealing member, a lid mounted on the metal sealing member and the organic sealant and a hermetically sealed cavity contained within the lid, metal sealing member and base.

The present invention also involves a method for hermetically sealing a device, comprising the steps of providing a base, applying a metal seal member along the top edge of the base, applying an organic sealant adjacent the metal seal member, covering the metal seal member and the organic sealant with a lid to create a cavity between the base, the lid and the metal seal member, compressing the metal seal member between the lid and the base to provide a hermetic seal within the cavity, and curing the organic sealant, wherein the seal is formed at room temperature.

Advantages of the present invention include providing a hermetically sealed package at economical material, labor and tool costs without the need for high sealing temperatures. The shrinkage of the organic sealant 26 during curing applies pressure to the metal seal member 28, enhancing the effectiveness of the hermetic seal.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

The drawings are neither to absolute nor relative scale and are intended to be generic in nature without restriction to the package geometry, number of IC package pins, number of electronic components contained or exact parts locations. Some thicknesses have been exaggerated for clarity in description.

DETAILED DESCRIPTION OF THE PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings and some possible alternates and descriptions.

TABLE 1

| Drawing Element | Generic Term | Preferred or Specific Examples | Other Alternate Examples or Descriptions |
|---|---|---|---|
| 10 | Lid | "Kovar" | Other metals |
| 12 | IC (Integrated circuit) | "Hybrid" | Chip, IC chip, die, IC die |
| 14 | Ring | "Kovar" | Other metals |
| 16 | Connections | "Gold" | Copper, other metals |
| 18 | Base | Ceramic | Alumina, "Kovar", AlN Cu, W, other metals. |
| 20 | Pins | Kovar plated with Sn | "Kovar" plated with Au, Copper plated with Sn, other metals. |
| 22 | Cap | Alumina | Serves function of both body and lid |
| 24 | Base | Alumina | |
| 26 | Organic Sealant | Epoxy resin mixed with hardener | Other viscous sealants |
| 28 | Metal seal ring | Indium | Other soft metals |
| 30 | Lid | | |
| 32 | Conductors | Metal | |
| 34 | Wires | .001" diameter | |
| 36 | Base | | |
| 37 | Top Edge | | Top Edge of Base |
| 38 | Lower base member | Alumina | |
| 40 | Upper base member | Alumina | |
| 46 | Cavity | | |

Figure 1:
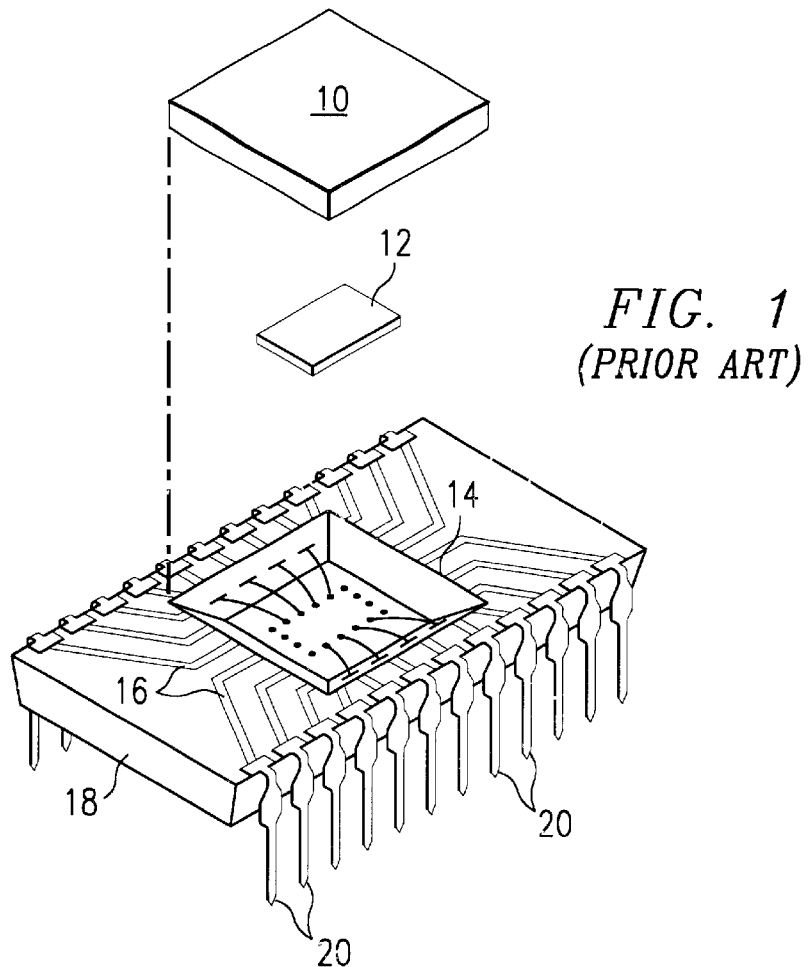
FIG. 1 shows an isometric view of a generic hermetically sealed ceramic (or alumina) package for an IC or hybrid (prior art)
Figure 2:
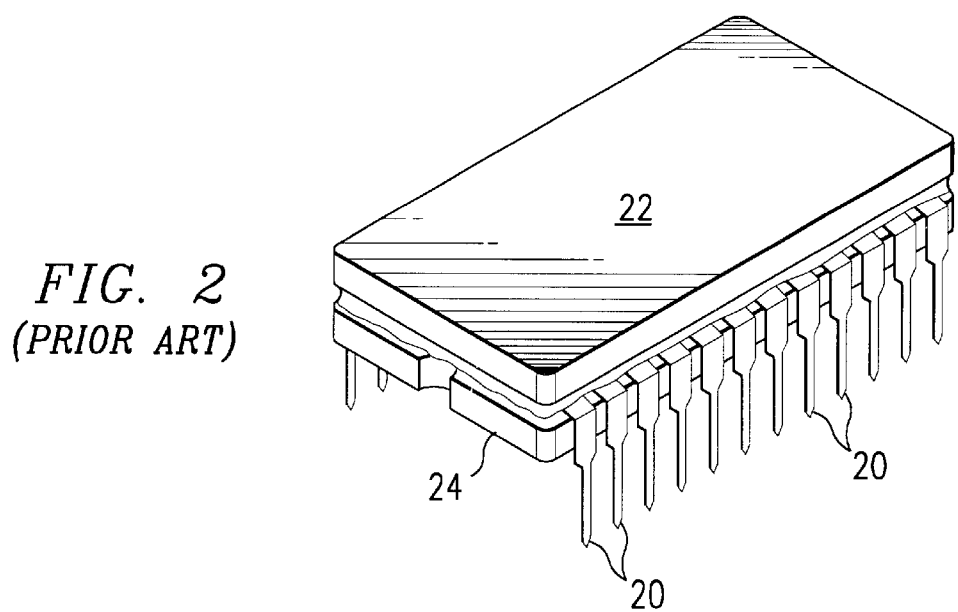
FIG. 2 is an isometric view of a ceramic package containing no "Kovar" ring (prior art)

FIGS. 1 and 2 are prior art drawings showing two existing hermetic packaging techniques for IC's and hybrids. In FIG. 1, the IC 12 is bonded to the connections 16 which are inside the ring 14. The ring 14, typically "Kovar", is hermetically bonded to the base 18 usually with a braze or a thermally melted glass frit (not shown.) Connections 16 are also electrically connected to the pins 20 which are themselves mechanically mounted to the ceramic (or alumina) base 18. The lid 10 is hermetically sealed to the ring 14 with a glass frit, for example, (not shown) by passing the ensemble through a heated (approximately 400–500° C.) furnace containing a vacuum or an inert gas such as nitrogen, helium or argon for several minutes.

FIG. 2 illustrates another type of hermetic IC chip or hybrid package, after final sealing. The alumina base 24 contains the chip lead pattern and has the mechanical support for the pins 20 as described for FIG. 1. The cap 22 serves the function of both body and lid and is also alumina. This unit may be hermetically sealed by using a glass frit between the cap 22 and base 24 and passing it through a heated furnace containing an inert gas.

The packages shown in FIGS. 1 and 2 may be hermetically sealed by other methods as practiced in the art. For example, the seal may be a solder seal which is heated to around 250–350° C., or the package may be solder brazed which involves temperatures in the range of about 400–500° C. There are lower temperature solder seals requiring temperatures of approximately 130–140° C., but these seals have yet to be perfected, for it has been found that these seals break over time, typically due to thermal cycling, and the materials are difficult to work with. Other methods of producing hermetic seals include seam welds, or laser welds, which have several disadvantages. With seam or laser welding, micro-cracks may form along the edge which can become leaks, rather elaborate equipment is required, and the temperature around the edge can exceed 1000° C. which may thermally radiate towards the IC.

A disadvantage of the prior art shown in FIGS. 1 and 2 is the high temperatures required to form the hermetic seal.

Some integrated circuits cannot withstand the high temperatures required by hermetic sealing methods of the past. The hybrid uncooled infrared detectors described in commonly assigned U.S. patent application, Ser. No. 08/182,268, entitled "Infrared Detector and Method" filed Jan. 13, 1994 by Belcher et al. comprises a hybrid structure that is preferably not subject to a temperature exceeding 105° C. The hybrid is bonded together with indium which melts at approximately 150° C. Other technologies have integrated circuit temperatures exposure limits in the range of 100° C. HgCdTe devices may be damaged if exposed to temperatures over 100° C. Also, the mechanical stresses produced during the curing of the encapsulation compound during packaging may be too high for the sub-structures such as leads and solder connections. Thus, there is a need for a hermetic IC package that is not exposed to high (greater than 100° C.) temperatures during the formation of the hermetic seal.

The present invention provides a method for hermetically sealing an IC or hybrid system package without the need for high temperatures in the sealing process. The sealing process of the present invention is accomplished with a double seal: an organic sealant and a metal seal member. In the preferred embodiments, the organic sealant is epoxy, and the metal seal member is a ring comprising indium.

Neither of the two sealant materials of the present invention is suitable by itself for hermetically sealing. Epoxy contains undesired chemicals that outgas at moderate temperatures. Also, cured epoxy leaks moisture into the package which may damage the components inside the assembly. Organic sealants such as epoxy do not provide a hermetic seal when used alone. Indium may not be used alone as a sealant because it provides a mechanically weak seal which is easily ruptured. Indium is a relatively soft element at room temperature which may be used to provide a cold hermetic pressure weld of the lid to a package body. However, since the weld is structurally weak, the seal may easily be broken by heat, vibration or shock.

In the described embodiments of the present novel invention, two seal components (a metal seal ring and an organic sealant) are utilized concurrently between the package body and the lid. The body and lid are pressed together while the two sealant components are sandwiched between them, slightly deforming the metal seal ring while allowing the organic sealant to flow. As the organic member cures, its volume shrinks uniformly to apply a greater magnitude of uniform pressure to the metal seal, thereby completing the cold welding and sealing process.

Figure 3A:
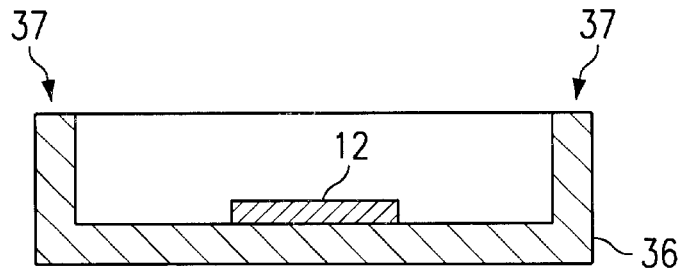
FIG. 3A is a cross-sectional elevational view of a base of a first embodiment of the present invention.
Figure 3B:
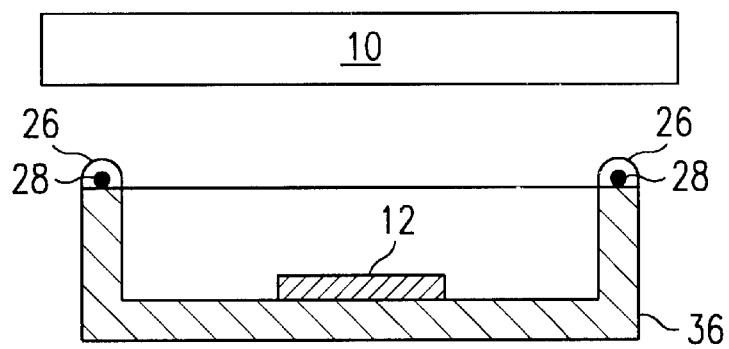
FIG. 3B shows the base of FIG. 3A with the metal seal ring and organic sealant applied on the edge of the base prior to sealing.
Figure 3C:
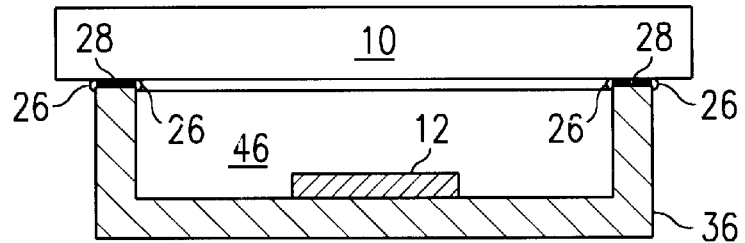
FIG. 3C shows the package of FIG. 3B after hermetic sealing.

A first embodiment of the present invention is shown in FIGS. 3A–3C. FIG. 3A illustrates the portion of an IC or hybrid system package to which this invention is pertinent. Analogous to the package shown in FIG. 1, the IC 12 is mounted and bonded to the alumina base 36. The base 36 is wide enough at the top edge 37 (or has a top flange, or lip) to allow the placement of a metal seal ring 28 and an organic sealant 26 along the top edge 37 of the base 36 as shown in FIG. 3B. The metal seal ring 28 is continuous and is preferably indium which forms a cold weld between the lid 10 and the base 36 during the application of pressure as shown in FIG. 3C. The organic member 26 is viscous and is preferably an epoxy resin mixed with hardener. The epoxy is preferably the type cured by the application of ultraviolet (UV) light at room temperature, although it may also be the type that is cured thermally at moderate temperature, e.g. 75–100° C.

Both the organic sealant 26 and the metal seal ring 28 are applied concurrently between the base 36 and the lid 10. The metal seal ring 28 and the organic sealant 26 are covered with the lid 10 to created a cavity 46 between the base, lid and metal seal ring. The lid 10 and base 36 are pressed together, slightly deforming the metal seal ring 28 while still allowing the organic sealant 26 to flow. The volume of the organic sealant 26 shrinks uniformly as it is cured, for example, by exposure to UV light. The organic sealant 26 cures within seconds of exposure to the UV. The shrinkage of the organic sealant 26 upon curing results in the application of a greater magnitude of uniform pressure to the metal seal ring 28, thereby completing the cold welding and sealing process. The organic sealant 26 forms a structurally rugged seal, which is beneficial because it will prevent or deter mechanical rupture of the metal seal ring 28 cold weld. A hermetic moisture barrier seal is formed by the metal seal ring 28.

In FIG. 3B, the metal seal ring 28 has been applied first, then the organic sealant 26 is applied over the metal seal ring 28. This results in a portion of the organic sealant 26 remaining within the cavity 46. However, the organic sealant may be applied along the outside of the base edge as will be discussed in the second embodiment and shown in FIG. 4B, in order to prevent the organic sealant from entering the cavity 46.

Figure 4A:
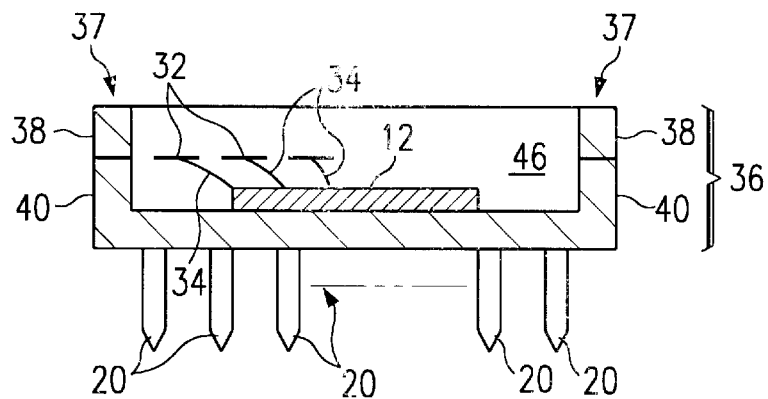
FIG. 4A shows a cross-sectional elevational view of a second embodiment of the present invention showing the base.
Figure 4B:
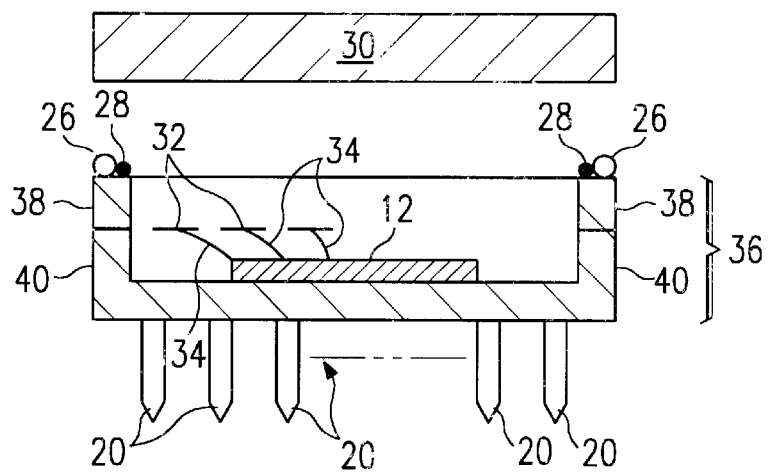
FIG. 4B shows the base of FIG. 4A with the metal seal ring and organic sealant applied on the edge of the base prior to sealing.
Figure 4C:
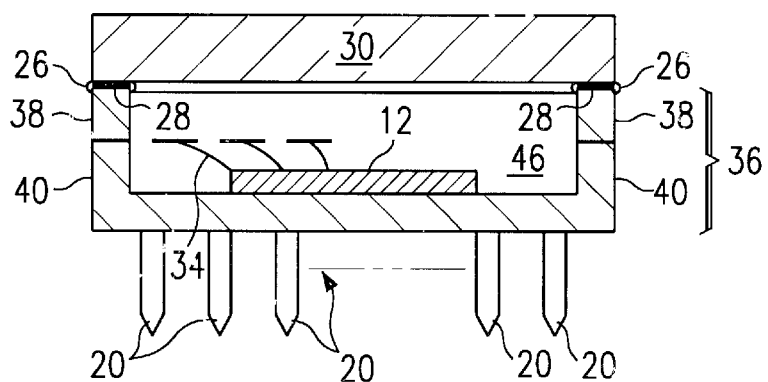
FIG. 4C shows the package of FIG. 4B after hermetic sealing, where the organic sealant is excluded from the interior of the package.

A second embodiment is illustrated in FIGS. 4A–4C where the base is comprised of two structures. FIG. 4A shows the base 36 comprised of a lower base member 38 and upper base member 40 which may be, for example, alumina. The upper base member 40 has a top edge 37. Metal conductors 32 extend through the walls of the base 36 at the junction of the lower base member 38 and upper base member 40. The pins 20 are brazed to the exterior protrusions of conductors 32. Small (typically 0.001 inch diameter) wires 34 form the electrical connections between the IC 12 and conductors 32. The metal seal ring 28 is placed along the top edge 37 of the base 36 as shown in FIG. 4B. The organic sealant 26 is dispensed outside the metal seal ring 28, for example, placed along the outside diameter of the metal seal ring 28, as shown. The organic sealant 26 is preferably epoxy and the metal seal ring 28 is preferably a continuous ring of indium. The placement of the organic sealant 26 and the metal seal ring 28 are such that, as the lid 30 is pressed down while in an unheated inert environment as shown in FIG. 4C, no organic sealant 26 remains within the enclosed cavity 46 formed by lid 30, the base 36, and the metal seal ring 28. In this manner, the metal seal ring 28 protects the hermetic environment within the cavity 46 from the gaseous products emitted by the organic sealant 26 during the curing process. It should be noted that in this embodiment, the organic sealant 26 may also be placed on top of the metal seal ring 28 as shown in FIG. 3B, so that a portion of the organic sealant 26 remains within the cavity 46.

Figure 5A:
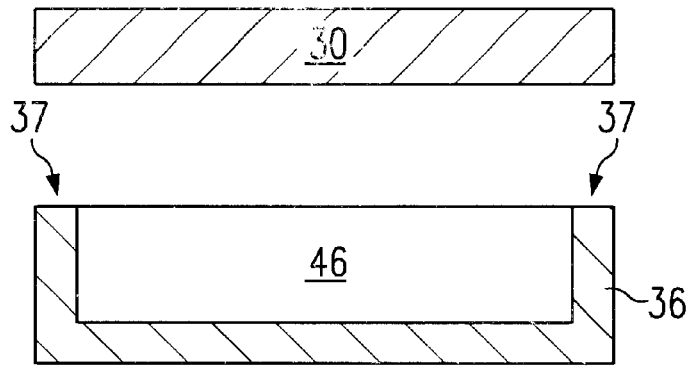
FIG. 5A shows a cross-sectional elevational view of a base upon which a third embodiment of the present invention will be performed.
Figure 5B:
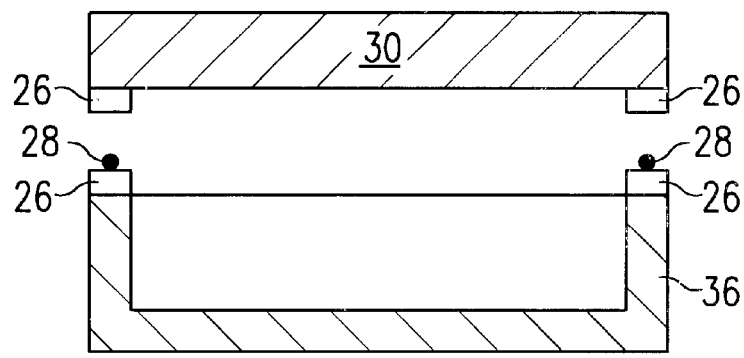
FIG. 5B shows the base of FIG. 5A with the organic sealant is applied to the lid and the top edge of the base prior to applying the metal seal ring.
Figure 5C:
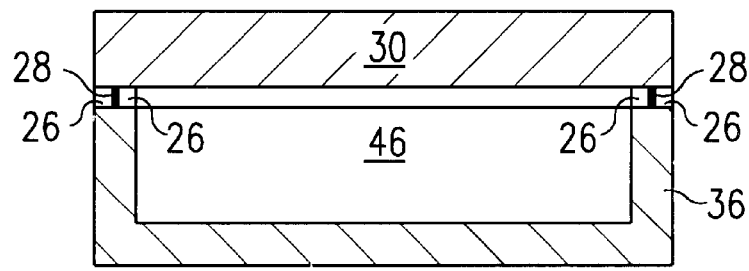
FIG. 5C shows the package of FIG. 5B after hermetic sealing.

A third embodiment of the present invention is demonstrated in FIGS. 5A–5C. FIG. 5A shows a base 36 having a top edge 37. The organic sealant 26 is applied to the both the outer edge of the lid 30 and the top edge 37 of the base 36 prior to applying the metal seal ring 28 over the organic sealant 26 on the base 36, for example, as shown in FIG. 5B. The organic sealant 26 is preferably epoxy and the metal seal ring 28 is preferably a continuous ring of indium. Then the lid 30 and base 36 are pressed together in the presence of a vacuum, for example, so that the metal seal ring 28 forms a cold weld between the lid 30 and the base 36, as shown in FIG. 5C. As the organic sealant 26 is cured, its shrinkage creates pressure against the metal seal ring to form a very tight, secure seal.

In each embodiment, the metal seal ring 28 is deformed twice; first by the compression of the lid and base, and then by the organic sealant as it shrinks. The shrinkage of the organic sealant 26 during the curing process applies a uniform pressure to complete the final seal of the cold weld formed by the metal seal ring 28 between the lid 10, 30 and base 36 or base 36. The metal seal ring 28 hermetically seals the package excluding gaseous components and moisture from the surrounding operating environment, while the organic sealant 26 supplies a strong mechanical seal to prevent rupture of the metal seal ring 28. The organic sealant 26 aids in the cold weld formation process, and also provides a structural support to the cold weld joint provided by the metal seal ring 28 once it is cured.

Various modifications and combinations of the illustrative embodiments, as well as other embodiments of the invention, will be apparent to persons skilled in the art upon reference to the description. Although Table 1 indicates various preferred materials and alternates, other alternates for processes and element materials are appropriate and will be obvious to those skilled in the art. For example, the drawings show a single chip 12 in the package but this may be a hybrid system composed of a plurality of chip components such as multiple IC's, capacitors, diodes and resistors. The package is also particularly suited for the uncooled infrared hybrid imaging systems described in *Texas Instruments Technical Journal,* Vol 11, No. 5, Sep–Oct 1994, pp. 2–36. The number of hermetic package configurations precludes the detailed listing of all to which this invention is applicable.

The tooling and holders that bring the various parts of the package together have not been discussed but one variant should be regarded as another preferred embodiment of this invention. The inert atmosphere environment prior to the initial pressing together of the packaging components can be either vacuum, as mentioned, or an inert atmosphere at lower than atmospheric pressure. When the sealed but uncured package is placed at atmospheric pressure, the internal low pressure applies a uniform sealing pressure along with the pressure supplied by the shrink of the curing epoxy.

The described invention of a hermetic cold weld seal offers several advantages over conventional hermetic sealing methods. The hermetic seal disclosed herein may be performed at room temperature, eliminating the need to expose the packaging system to high temperatures which may damage components and thereby decrease manufacturing yields. The organic sealant provides a constant pressure to the cold weld of the metal seal ring, creating a very robust seal capable of withstanding temperature cycling and mechanical stresses, with a longer life than hermetic seals of the past. The time required to form the hermetic seal is shorter for the present invention, since a heating step would typically be longer than a UV light exposure step to cure the epoxy. The UV equipment required to cure the epoxy is inexpensive, and indium and epoxy are both inexpensive materials, so there are cost-saving benefits from the invention. Placing the organic sealant around the outside of the metal seal ring prevents the organic sealant from entering inside the hermetic cavity, which is a further advantage of the present invention, since the fragile materials enclosed within the cavity are not exposed to the chemicals that may outgas from the organic sealant.

While the invention has been described with reference to illustrative embodiments, this description is not intended to be construed in a limiting sense. Various modifications and combinations of the illustrative embodiments, as well as other embodiments of the inventions, will be apparent of persons skilled in the art upon reference to the description. It is therefore intended that the appended claims encompass any such modifications or embodiments.

What is claimed is:

1. A method for hermetically sealing a device, comprising the steps of:

providing a base having a top edge, said base having an outside;

applying an organic sealant along said top edge of said base;

applying a metal seal ring over said organic sealant on said top edge of said base;

covering said metal seal ring and said organic sealant with a lid to create a cavity between at least said base, said lid and said metal seal ring;

compressing said metal seal ring between said lid and said base to provide a hermetic seal within said cavity, wherein said seal is formed at room temperature in an inert environment; and curing said organic sealant, wherein at least said covering step is performed in a subatmospheric atmosphere.

2. The method of claim 1 wherein said step of applying a metal seal ring comprises applying a metal seal ring comprising indium.

3. The method of claim 1 wherein said step of applying a metal seal ring comprises applying a continuous metal seal ring.

4. The method of claim 1 wherein said step of applying an organic sealant comprises applying an organic sealant comprising epoxy.

5. The method of claim 1 wherein said curing step comprises curing said organic sealant with UV light.

6. The method of claim 1 wherein said step of providing a base comprises providing a base comprising alumina.

7. The method of claim 1 wherein said device comprises an integrated circuit.

8. The method of claim 1 wherein said device comprises a hybrid IC.

9. The method of claim 1 wherein said step of applying and organic sealant comprises applying an organic sealant on said top edge only along said outside of said base, wherein said organic sealant is not contained within said cavity.

10. The method of claim 1 wherein said curing step is performed at a temperature of less than or equal to 100° C.

11. The method of claim 1 wherein at least said covering step is performed in a vacuum.

* * * * *